United States Patent
Kido et al.

(10) Patent No.: US 7,429,300 B2
(45) Date of Patent: Sep. 30, 2008

(54) SUCCESSIVE VAPOUR DEPOSITION SYSTEM, VAPOUR DEPOSITION SYSTEM, AND VAPOUR DEPOSITION PROCESS

(75) Inventors: Junji Kido, 9-4-3 Umamikita, Kouryou-cho, Kitakatsuragi-gun, Nara-ken (JP); Tokio Mizukami, Kanagawa-ken (JP)

(73) Assignees: Junji Kido, Narea-ken (JP); International Manufacturing and Engineering Services Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/152,697

(22) Filed: May 22, 2002

(65) Prior Publication Data

US 2002/0179013 A1   Dec. 5, 2002

(30) Foreign Application Priority Data

May 23, 2001   (JP)   ............................. 2001-153367

(51) Int. Cl.
*C23C 16/00*   (2006.01)
(52) U.S. Cl. ...................................... 118/719; 118/726
(58) Field of Classification Search ................ 118/718, 118/726; 392/386, 389; 432/263
See application file for complete search history.

(56) References Cited

U.S. PATENT DOCUMENTS

| | | | | |
|---|---|---|---|---|
| 2,962,538 | A * | 11/1960 | Alexander | 373/112 |
| 3,647,197 | A * | 3/1972 | Holloway | 432/263 |
| 4,016,310 | A * | 4/1977 | Ing | 427/251 |
| 4,596,721 | A | 6/1986 | Brock et al. | 427/82 |
| 4,897,290 | A * | 1/1990 | Terasaka et al. | 427/162 |
| 5,042,423 | A * | 8/1991 | Wilkinson | 118/500 |
| 5,227,203 | A * | 7/1993 | Kibe et al. | 427/523 |
| 5,820,682 | A * | 10/1998 | Sung et al. | 118/726 |

(Continued)

FOREIGN PATENT DOCUMENTS

JP   04167969 A *   6/1992

(Continued)

OTHER PUBLICATIONS

Translation of Written Decision of Patent Application, Intellectual Property Office, Ministry of Economic Affairs for Filing No. 9110680.

(Continued)

*Primary Examiner*—Karla Moore
(74) *Attorney, Agent, or Firm*—McCormick, Paulding & Huber LLP

(57) ABSTRACT

A successive vapor deposition system in which a vapor deposition material is heated, vaporized in a vacuum, and deposited onto a vapor deposition area of a substrate, includes a conveyer which conveys the substrate in a conveying direction parallel to a plane on which the substrate lies, wherein the vapor deposition area faces downward and is exposed through the underside of the conveyer; a plurality of vapor deposition chambers aligned in the conveying direction, each the vapor deposition chamber including a space through which the substrate is conveyed; at least one container positioned in each of the plurality of vapor deposition chambers below the plane on which the substrate lies, and containing the vapor deposition material, wherein a width of the container covers the vapor deposition area in a direction perpendicular to the conveying direction; and a heating medium provided for the container.

27 Claims, 5 Drawing Sheets

U.S. PATENT DOCUMENTS 6,179,923 B1    1/2001   Yamamoto et al. .......... 118/719
6,340,501 B1 *  1/2002   Kamiyama et al. ....... 427/255.6

FOREIGN PATENT DOCUMENTS

JP           06136537 A  *  5/1994
JP           06212425        8/1994
WO           WO 98/50916 A1 * 11/1998
WO           01/31081 A1      5/2001
WO           WO 01/31081 A1   5/2001

OTHER PUBLICATIONS

Copy of Search Report for EP 02 01 1347 dated Sep. 6, 2002.
Translation of Written Decision of Patent Application, Intellectual Property Office, Ministry of Economic Affairs for Filing No. 9110680, No Date.

* cited by examiner

SUCCESSIVE VAPOUR DEPOSITION SYSTEM, VAPOUR DEPOSITION SYSTEM, AND VAPOUR DEPOSITION PROCESS

BACKGROUND OF THE INVENTION

1. Field of the Invention

The present invention relates to a successive vapor deposition system suitable for successive formation of thin layers of different vapor deposition materials onto a substrate. The present invention also relates to a vapor deposition system and a vapor deposition process.

2. Description of the Related Art

A typical organic electroluminescent device generally has a hole-transporting layer, a luminescent layer, an electron-transporting layer and an electrode layer which are formed by vacuum deposition successively on an ITO (Indium tin oxide) glass substrate. In conventional successive vapor deposition systems for forming such successive layers on the glass substrate, a plurality of vacuum deposition chambers (which include a substrate stock chamber and a preliminary treatment chamber) for evaporating different vapor deposition materials onto the glass substrate are arranged radially with respect to a central vacuum carrier robotic chamber, so that the glass substrate is successively transferred from one chamber to another among the plurality of vacuum deposition chambers via a robotic system of the central vacuum carrier robotic chamber to form thin layers of the different materials on the glass substrate.

In such conventional successive vapor deposition systems, the substrate needs to be successively displaced from one chamber to another, among the plurality of vacuum deposition chambers, via the central vacuum carrier robotic chamber, which is a time-consuming and inefficient operation. In addition, vapor deposition materials are consumed excessively because of the fundamental structure of the conventional systems in which vacuum deposition chambers are merely arranged around the central vacuum carrier robotic chamber. Specifically, in such conventional successive vapor deposition systems, different vapor deposition materials and the substrate are respectively arranged on lower and upper areas in a vacuum deposition chamber, and the different vapor deposition materials are heated to be vaporized (or sublimed) while the substrate is being rotated on its axis or revolved around the axis of the central vacuum carrier robotic chamber to form layers of the different vapor deposition materials entirely on one side of the substrate with a substantially even layer thickness. However, an excessive consumption of the vapor deposition materials cannot be avoided because the evenness of the layers is ensured only by depositing a portion of vaporized molecules onto the substrate, the vaporized molecules of which are spread out widely upwards in all directions from crucibles or boats, each of which is approximately regarded as a point source of evaporation. In other words, an excessive consumption of the vapor deposition materials cannot be avoided because most of the vaporized molecules are deposited onto inner walls of the vacuum deposition chambers; only a few percent of the vaporized molecules is deposited onto the substrate in practice. Some vapor deposition materials used in production of organic electroluminescent devices are extremely expensive, e.g., tens of thousands of yen per gram. Accordingly, an excessive consumption of the vapor deposition materials causes a substantial increase in the cost of production.

In an organic electroluminescent device, a host material and at least one dopant material are generally co-deposited on the substrate at a specific ratio (e.g., a ratio of 100 to 1, or a ratio of 100 to 0.5) in order to determine the luminescent color of an organic luminescent layer. However, in conventional organic electro-luminescent devices, most of such different materials are wasted, and further, it becomes difficult to retain the specific ratio over time.

SUMMARY OF THE INVENTION

The present invention is devised in view of the problems noted above, and accordingly provides a vapor deposition system which makes it possible to form layers of vapor deposition materials on a substrate successively with efficiency of time, and with a minimum waste of the vapor deposition materials.

The present invention also provides a vapor deposition system which makes it possible to co-deposit different vapor deposition materials onto a substrate to form layers of the different vapor deposition materials thereon at a specific ratio with a minimum fluctuation thereof.

For example, in an aspect of the present invention, a successive vapor deposition system is provided, in which at least one vapor deposition material is heated, vaporized in a vacuum, and deposited onto an area to be deposited (hereinafter, a vapor deposition area) of a substrate. The successive vapor deposition system includes a conveyer which conveys the substrate in a conveying direction parallel to a horizontal plane on which the substrate lies; a plurality of vapor deposition chambers aligned in the conveying direction; at least one container positioned, in each of the plurality of vapor deposition chambers, below the horizontal plane on which the substrate lies; and a heating medium provided for the container.

The vapor deposition area of the substrate faces downward and is exposed through the underside of the conveyer. Each of the vapor deposition chambers includes a space through which the substrate is conveyed in the conveying direction. The container contains the vapor deposition material, and the width thereof covers the vapor deposition area in a direction perpendicular to the conveying direction.

A plurality of containers for containing the vapor deposition material can be positioned in at least one of the plurality of vapor deposition chambers. The top openings of the plurality of containers extend in a direction perpendicular to the conveying direction so that respective vaporized materials ascending from the plurality of containers are co-deposited onto a common area on the vapor deposition area of the substrate.

At least one of the plurality of containers is adjustably tilted at a desired angle relative to another container in order to define the common area.

According to another aspect of the present invention, the vapor deposition system is provided with a single vapor deposition chamber in which at least one vapor deposition material is heated, vaporized in a vacuum, and deposited onto a vapor deposition area of a substrate.

The conveyer conveys the substrate in a vapor deposition chamber in the conveying direction parallel to the horizontal plane on which the substrate lies, while the vapor deposition area faces downward and is exposed through the underside of the conveyer. The container is provided, in the vapor deposition chamber, below the horizontal plane on which the substrate lies, and contains the vapor deposition material. The width of the container covers the vapor deposition area in a direction perpendicular to the conveying direction. The heating medium is provided for the container for heating the vapor deposition material.

As still another aspect of the present invention, the vapor deposition system can be used as an independent co-deposition system. In this aspect of the present invention, a plurality of the containers, which are provided in a vapor deposition chamber, are arranged so that respective vaporized materials ascending from the plurality of containers are co-deposited onto a common area on the vapor deposition area of the substrate. Moreover, at least one of the plurality of containers is adjustably tilted at a desired angle relative to another container in order to define the common area in the vapor deposition area of the substrate.

In regard to the container, a depth of the container is determined so that the vapor deposition material to be vaporized which is contained therein can ascend in a direction of the depth of the container and toward the vapor deposition area of the substrate. According to this arrangement, the vapor deposition material is vaporized on the vapor deposition area of the substrate by utilizing directivity of molecules of the vapor deposition material due to the so-called chimney effect; however, it is understood, in the prior art, that a container (a crucible) for containing a vapor deposition material designed to have the chimney effect is not preferable, when attempting to achieve an even-layer forming on the vapor deposition area.

Furthermore, as long as the container is designed to cover the whole vapor deposition area in a direction perpendicular to the conveying direction, any type of container, such as single-type container or a separate-type container, can be utilized.

In the case where a single-type container is employed, a container having the shape of a rectangular box elongated in a direction perpendicular to the conveying direction is preferable. In other words, the crucible, which is formed as explained, can cover the vapor deposition area in the direction perpendicular to the conveying direction with the minimum length of the crucible.

Furthermore, it is preferable that the inner space of the crucible be partitioned by a plurality of partitions in order to heat the vapor deposition material uniformly. More specifically, the partition extend parallel to each other in a direction oblique to the conveying direction so that a layer of the vapor deposition material is formed uniformly on the vapor deposition area. On the other hand, if the partitions extend parallel to the conveying direction, the density of molecules of the vapor deposition material just above the partitions becomes sparse due to the chimney effect, even under the condition that the heat can be uniformly applied to the vapor deposition material. It is understood that a plurality of partitions is equivalent to plural containers arranged in a direction perpendicular to the conveying direction, and that a container in which the vapor deposition material is provided can be separated into plural containers.

As a further aspect, the present invention can be applied to a vapor deposition process in which at least one vapor deposition material is heated, vaporized in a vacuum, and deposited onto a vapor deposition area of a substrate. The vapor deposition process comprising the following steps of:

conveying the substrate into an inner space of at least one vapor deposition chamber in a conveying direction parallel to a horizontal plane on which the substrate lies, while the vapor deposition area faces downward and is exposed via an opening in the underside of the conveyer;

positioning the substrate, in the inner space of the vapor deposition chamber, above at least one container which contains the vapor deposition material, is positioned in the inner space of the vapor deposition chamber, and the width of which covers the vapor deposition area in a direction perpendicular to the conveying direction; and heating the container to evaporate the vapor deposition material onto the vapor deposition area.

In the vapor deposition process described above, a plurality of vapor deposition chambers can be provided in the conveying direction along which a substrate to be deposited is conveyed. A container is positioned in each of the vapor deposition chambers, and the heating can be performed in each of the vapor deposition chambers in order to vaporize the vapor deposition material contained therein.

In the vapor deposition process described above, a plurality of the containers can be provided in a vapor deposition chamber. In each of the containers, different vapor deposition materials are provided therein. Each of the containers is independently heated so that the different vapor deposition materials can be vaporized.

The vapor deposition materials used in the successive vapor deposition system, the vapor deposition system or the vapor deposition process according to the present invention can be any vapor deposition materials as long as they can be vaporized via the application of heat. Such vapor deposition materials can be, e.g., any known functional organic-thin-layer forming material used for the formation of layers of an organic electroluminescent device, an organic solar battery or an organic FET (field effect transistor). Such vapor deposition materials can also be, e.g., a metal, or any known inorganic compound material such as oxide, nitride, carbide or halogenide. Typical organic materials of the luminescent layer or the electron-transporting layer of the organic electroluminescent device include tris(8-hydroxyquinoline)aluminum complex compound (commonly called "Alq$_3$"). Typical organic materials of the hole-transporting layer of the organic electroluminescent device include arylamine compounds such as N,N'-diphenyl-N,N'-bis(3-methylphenyl)-1,1'-diphenyl-4,4'-diamine (commonly called "TPD").

On the other hand, typical inorganic materials used for the organic electroluminescent device include inorganic compound materials such as metal halide, and also include aluminum, magnesium and silver that are mainly used as materials for an electrode. It should be noted that the present invention does not concern the vapor deposition materials, accordingly, other examples of organic or inorganic materials used for the formation of layers of the organic electroluminescent device are not herein disclosed.

The present disclosure relates to subject matter contained in Japanese Patent Application No.2001-153367 (filed on May 23, 2001) which is expressly incorporated herein by reference in its entirety.

BRIEF DESCRIPTION OF THE DRAWINGS

The present invention will be described below in detail with reference to the accompanying drawings in which.

DESCRIPTION OF THE PREFERRED EMBODIMENTS

Figure 1:
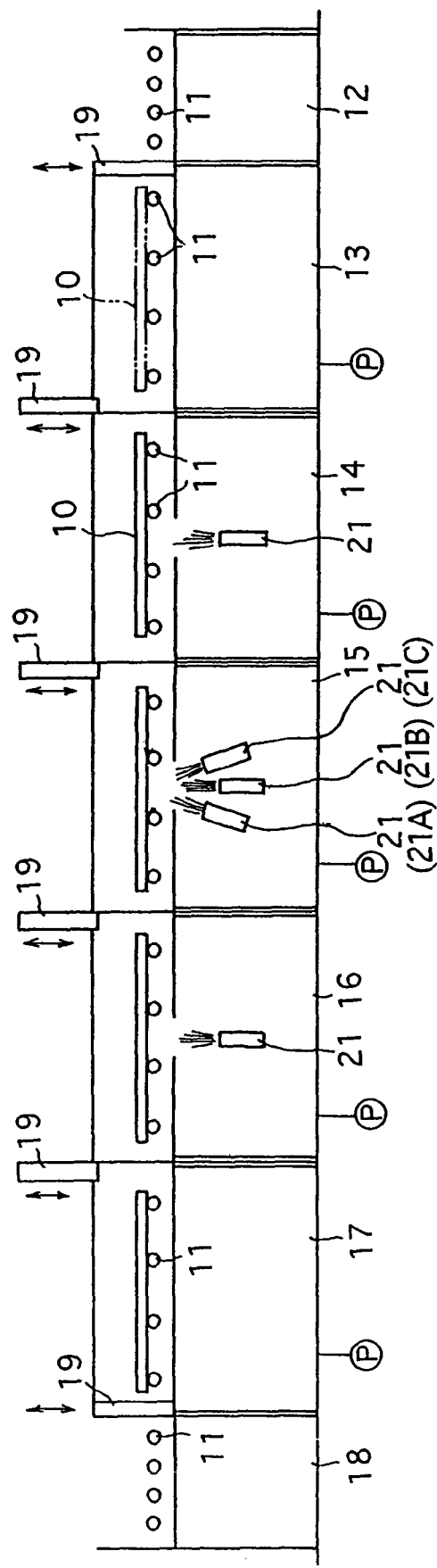
FIG. 1 is a general side view of an embodiment of a successive vapor deposition system according to the present invention.

FIG. 1 shows an embodiment of a successive vapor deposition system according to the present invention. The successive vapor deposition system 1 is provided with a plurality of substrate holders 10 and a plurality of conveying rollers 11 which conveys the substrate holders 10 from right to left as viewed in FIG. 1. The plurality of substrate holders 10 and the plurality of conveying rollers 11 constitute a conveyer. The plurality of conveying rollers 11 are driven by a motor (not shown). The successive vapor deposition system 1 is provided, in a conveying direction of the substrate holders 10 (the horizontal-leftward direction as viewed in FIG. 1; hereinafter referred to as "conveying direction"), with a preparation stage 12, a preliminary vacuum chamber 13, a first vapor deposition chamber 14, a second vapor deposition chamber (co-deposition chamber) 15, a third vapor deposition chamber 16, a preliminary ejection chamber 17 and an ejection stage 18, in this order from right to left as viewed in FIG. 1. Each of the chambers 13 through 17 includes a space (conveyance space) through which the substrate holders 10 are conveyed in the conveying direction, and is partitioned so that vacuum in the chamber can be controlled via a corresponding gate 19 independently of the other chambers. Namely, the successive vapor deposition system 1 is provided for each of the chambers 13 through 17 with a vacuum pump P so that the degree of vacuum in each of the chambers 13 through 17 can be controlled with the associated vacuum pump P. Each gate 19 can be controlled to open only during the conveyance of one substrate holder 10 from the previous chamber (or stage) to the subsequent chamber (or stage) in the conveying direction. Alternatively, each gate 19 can remain opened at all times if the substrates (not shown in FIG. 1) held by the substrate holders 10 are successively conveyed thereby for mass production. Conventional techniques are used for the formation and the operation of each of the chambers 13 through 17. The successive vapor deposition system 1 is preferably provided in a clean room.

Figure 2:
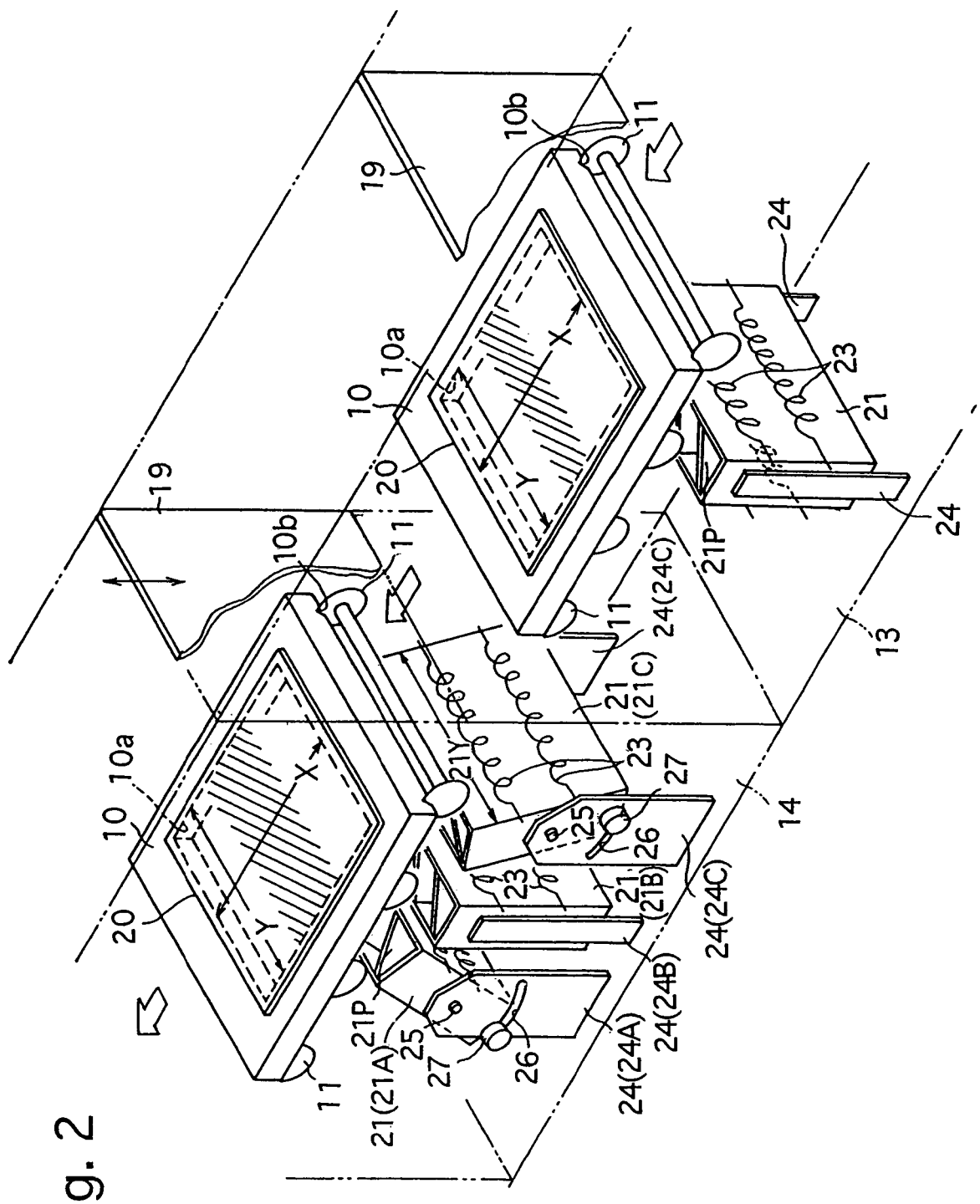
FIG. 2 is a perspective view of a fundamental portion of the successive vapor deposition system shown in FIG. 1.
Figure 3:
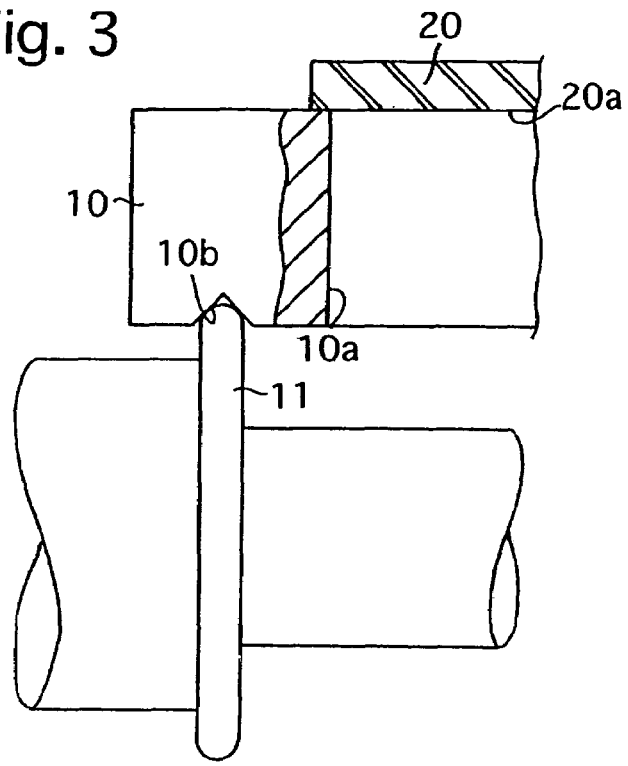
FIG. 3 is a partial cross-section of a fundamental portion of a transfer system for the transfer of substrates.

As shown in FIGS. 2 and 3, each substrate holder 10 is provided, at a center thereof with a rectangular opening 10a, and is further provided, on an bottom surface thereof, with a pair of V-grooves 10b which extend parallel to each other in the conveying direction. As shown in FIG. 3, a glass substrate 20 is mounted on each substrate holder 10 with an area 20a to be vapor-deposited (hereinafter, an vapor-deposition area) 20a of the glass substrate 20 being open (exposed) to the underside of the substrate holder 10 via the opening 10a. The vapor deposition area 20a is defined by the opening 10a as a rectangular area having a length X in the conveying direction and a width Y in a direction perpendicular to the conveying direction. Although one glass substrate 20 is mounted on one substrate holder 10 in the illustrated embodiment, more than one glass substrate 20 can be mounted on one substrate holder 10 in accordance with the size of the glass substrate 20.

Accordingly, when the conveying rollers 11 are driven, the glass substrate 20, in which the vapor deposition area 20a is exposed to the underside of the associated substrate holder 10 via the opening 10a thereof, is conveyed from the preparation stage 12 to the ejection stage 18 in sequence via the intervening chambers 13, 14, 15, 16 and 17.

If the size of the vapor deposition area 20a needs to be defined by a shadow mask (not shown), the shadow mask can be integrated with the substrate holder 10.

In the illustrated embodiment shown in FIG. 1, the successive vapor deposition system 1 is provided, in each of the first and third deposition chambers 14 and 16 below a horizontal plane on which the substrate holders 10 lie, with a container (crucible) 21. The successive vapor deposition system 1 is provided, in the second vapor deposition chamber (co-deposition chamber) 15, with three crucibles 21 (21A, 21B and 21C). These five crucibles 21 have basically the same structure, and each crucible 21 is in the shape of a rectangular box elongated in a direction perpendicular to the conveying direction. Forming the crucible 21 as explained is advantageous, since the vapor deposition area 20a can be covered by the minimum length (width) of the crucible 21 in the direction perpendicular to the conveying direction. In other words, as long as a crucible 21 is designed to have the above advantage, other factors of a crucible 21, such as the shape and orientation thereof, have some degree of freedom.

Figure 6:
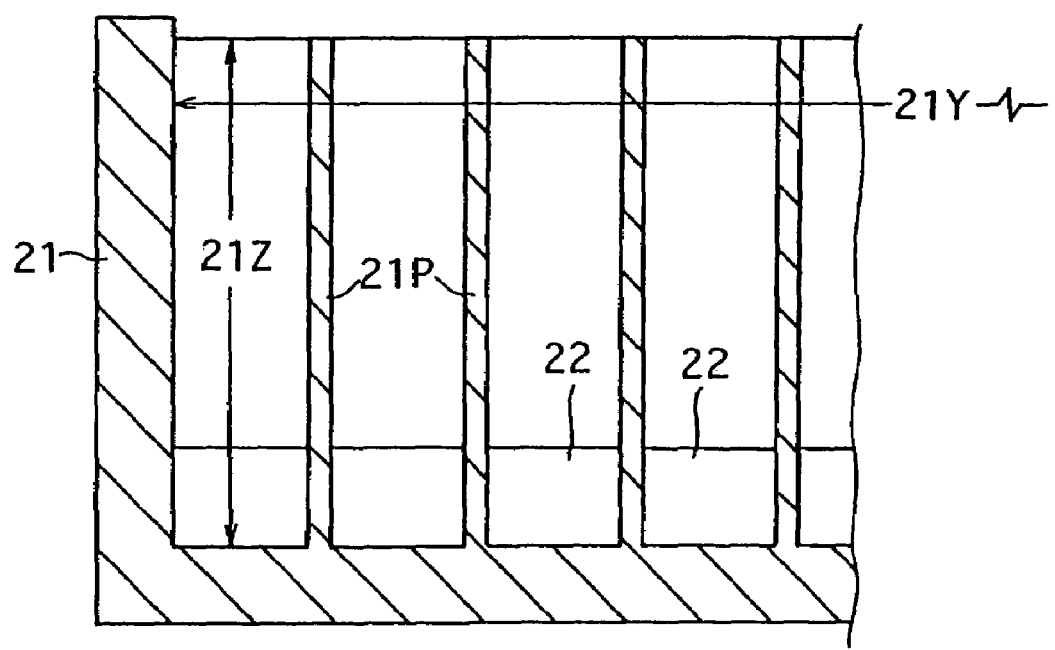
FIG. 6 is a cross sectional view of the crucible shown in FIG. 4A, taken along VI-VI line in FIG. 4A.

Each crucible 21 is designed so that an inner length 21Y (see FIGS. 2, 4A and 6) thereof in a direction perpendicular to the conveying direction is slightly greater than the width Y of the vapor deposition area 20a. Namely, the inner length 21Y is determined so that the crucible 21 fully covers the vapor deposition area 20a (the width Y) in a direction perpendicular to the conveying direction.

In addition, a depth 21Z (see FIGS. 6 and 7) of each crucible 21 is determined so that the vapor deposition material 22 contained in the crucible 21 to be vaporized by the application of heat can ascend in a direction of the depth 21Z within the crucible 21 (toward the vapor deposition area 20a) efficiently. In other words, this arrangement is to obtain the chimney effect on the vaporized material 22. Likewise, in order to obtain the chimney effect, the amount of the vapor deposition material 22 contained in the crucible 21 is set at a small amount. An inner width 21X of each crucible 21 is preferably determined to be smaller than each of the inner length 21Y and the depth 21Z so that the layer formed on the vapor deposition area 20a does not become uneven in the conveying direction.

Figure 4A:
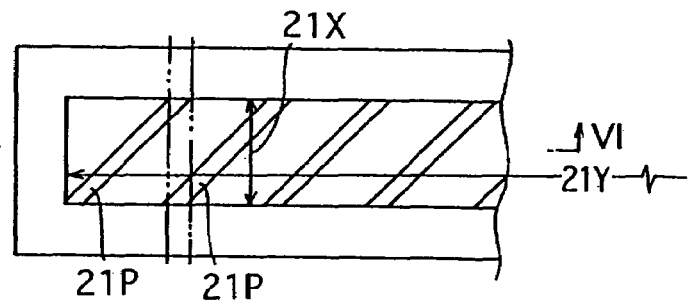
FIGS. 4A, 4B and 4C are plan views of examples of a crucible provided in the successive vapor deposition system shown in FIG. 1, showing examples of the structure of partitions formed therein.
Figure 4B:
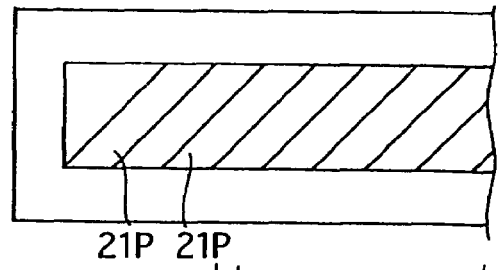
Figure 4C:
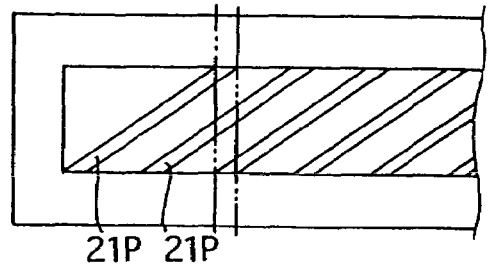
Figure 5:
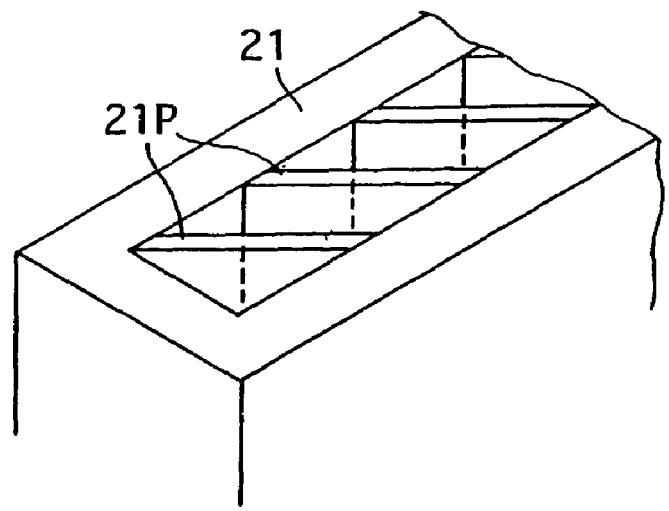
FIG. 5 is a perspective view of the crucible shown in FIG. 4A.

The inner space of each crucible 21 is partitioned by a plurality of partitions 21P. FIGS. 4A, 4B and 4C show different examples of the way to partition the inner space of each crucible 21. The partitions 21P are formed in each crucible 21 for the purpose of applying heat to the vapor deposition material 22 in the crucible 21 uniformly to thereby vaporize the vapor deposition material 22 uniformly. The partitions 21P extend parallel to one another but do not extend parallel to the conveying direction. Namely, the partitions 21P extend parallel to one another in a direction oblique to the conveying direction. This oblique arrangement of the partitions 21P is advantageous to form a layer of the vapor deposition material uniformly on the vapor deposition area 20a because each point on the vapor deposition area 20a can passes over at least one partition of each crucible 21 so that the vaporized material ascending therefrom can reliably be deposited onto the vapor deposition area 20a. Hence, the angle of inclination of the partitions 21P and the spacing therebetween are determined so that a layer of the vapor deposition material is formed uniformly. Each crucible 21, together with the partitions 21P thereof, is preferably made of a high thermal conductive material (e.g., a material having a thermal conductivity of at least 1W/m*K) such as carbon.

The vapor deposition material 22 contained in each crucible 21 is precisely weighed to be distributed equally among the partitions in each crucible 21. If the vapor deposition material 22 is not distributed equally among the partitions in each crucible 21, the density of molecules of the vapor deposition material vaporized from each partition becomes uneven with time even if the temperature distribution of the vaporized vapor deposition material 22 is even in a direction perpendicular to the conveying direction, i.e., in the direction of the inner length 21Y. This makes it difficult to ensure the evenness of the layer of the vapor deposition material over the whole vapor deposition area 20a.

Figure 7:
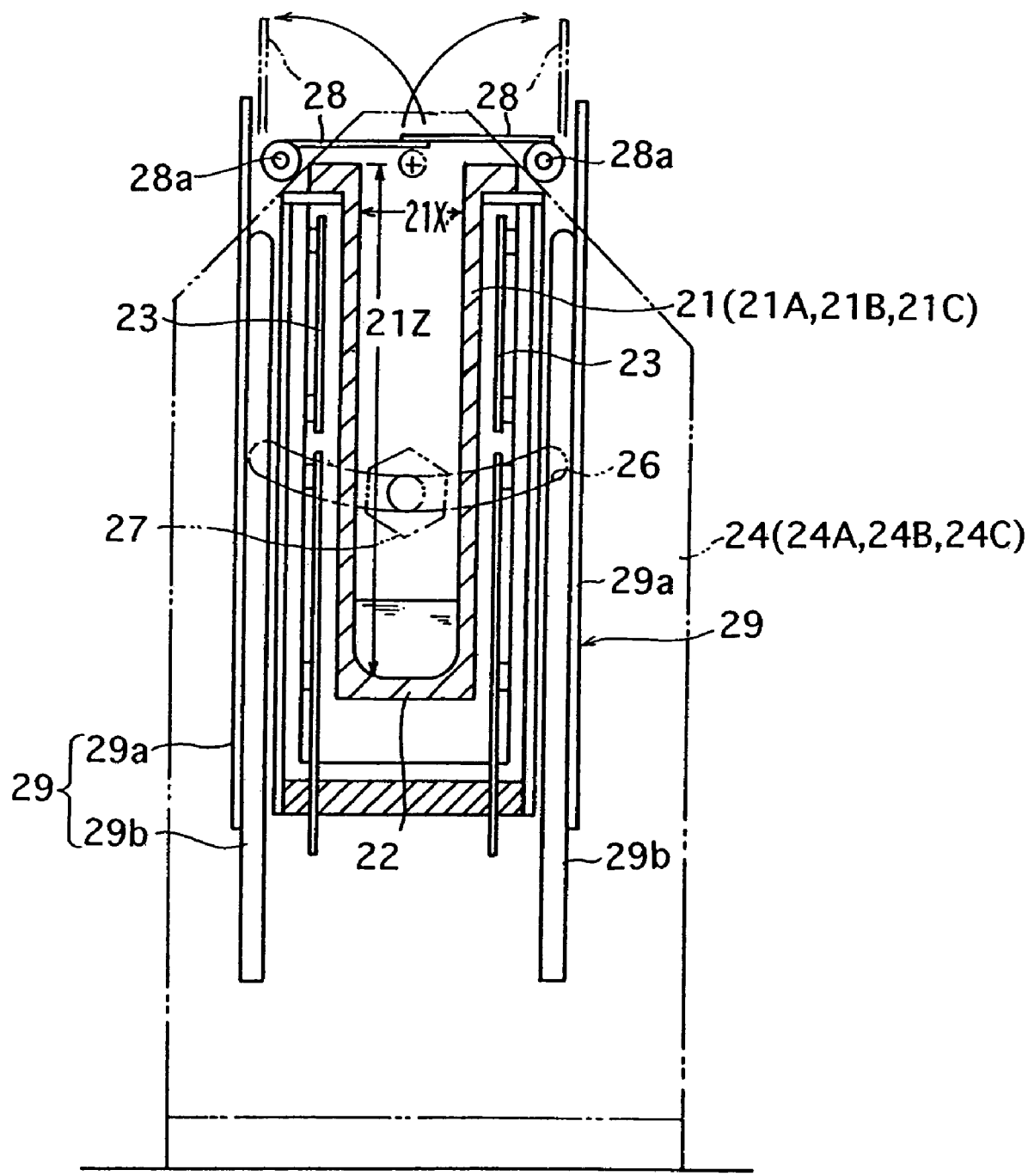
FIG. 7 is a longitudinal cross sectional view of the crucible.

As shown in FIGS. 2 and 7, the successive vapor deposition system 1 is provided, around each crucible 21, with some filaments (heating wires) 23 serving as a heating medium. The temperature of each crucible 21 can be controlled by adjusting the electric current applied to the filaments 23.

Each of the two crucibles 21 provided in the first and third vapor deposition chambers 14 and 16 is fixed to a pair of stationary vertical plates 24 to be held vertically therebetween. Specifically, if a central plane of each crucible 21 is defined as a plane which passes through the center of the inner width 21X of the crucible 21 in a direction of the depth 21Z, each of the two crucibles 21 is fixed to the associated pair of vertical plates 24 so that the central plane extends in a direction perpendicular to the vapor deposition areas 20a of the glass substrates 20, which are conveyed in a horizontal direction. On the other hand, regarding the remaining three crucibles 21 (21A, 21B and 21C) provided in the second vapor deposition chamber (co-deposition chamber) 15, the respective rectangular top openings of the three crucibles 21 (21A, 21B and 21C) extend in a direction perpendicular to the conveying direction so that the respective vaporized materials ascending from the three crucibles 21 (21A, 21B and 21C) are co-deposited onto a common area on the vapor deposition area 20a of each glass substrate 20. In particular, the central crucible 21B is fixed to a pair of stationary vertical plates 24 (24B) to be held vertically therebetween in a manner similar to that of each of the two crucibles 21 provided in the first and third vapor deposition chambers 14 and 16, while each of the other two crucibles 21 (21A and 21C) is rotatably held between a pair of stationary vertical plates 24 (24A or 24C) about a shaft 25 which extends in a direction perpendicular to the conveying direction, so that the angle of inclination of each of the two crucibles 21A and 21C relative to the central crucible 21B is adjustable about the shaft 25. One of the pair of stationary vertical plates 24A which supports the crucible 21A is provided with a circular arc slot 26 which extends about the associated shaft 25, and the crucible 21A is provided with a set screw 27 which passes through the circular arc slot 26 to be screwed into the crucible 21A (see FIGS. 1 and 7). Likewise, one of the pair of stationary vertical plates 24C that supports the crucible 21C is provided with a circular arc slot 26 which extends about the associated shaft 25, while the crucible 21C is provided with a set screw 27 which passes through the circular arc slot 26 to be screwed into the crucible 21C (see FIGS. 1 and 7). Accordingly, such angle-adjusting structures of the two crucibles 21A and 21C make it possible to co-deposit the respective vaporized materials ascending from the three crucibles 21 (21A, 21B and 21C) onto a common area on the vapor deposition area 20a of each glass substrate 20. In practice, the respective angles of the two crucibles 21A and 21C relative to the central crucible 21B are preferably adjusted so that the central plane of each of the two crucibles 21A and 21C intersects the central plane of the central crucible 21B at a straight line on the vapor deposition area 20a of a given glass substrate 20. The ideal angles of the two crucibles 21A and 21C relative to the central crucible 21B can be easily determined by experimentation.

As shown in FIG. 7, the successive vapor deposition system 1 is provided, at the top of each crucible 21, with a double-doored shutter 28 for opening and closing the open top of the crucible 21, and/or is provided, around each crucible 21, with a water-cooled jacket 29 (both the double-door shutter 28 and the water-cooled jacket 29 are shown in FIG. 7). The double-doored shutter 28 is provided with a pair of shutter plates, each pivoted at a corresponding pivot 28a to open and close the open top of the crucible 21. For instance, the double-doored shutter 28 opens at the time the temperature of the associated crucible 21 (the vapor deposition material 22) reaches a predetermined temperature, and at the same time when a glass substrate 20 is being conveyed to be positioned above the associated crucible 21; and the shutter 28 closes at all other times. The water-cooled jacket 29 is provided with a panel 29a which surrounds the crucible 21 with a predetermined gap between the panel 29a and the crucible 21, and is further provided, on an inner surface of the panel 29a, with a cooling tube 29b in which cooling water travels to minimize the effect of the radiation of heat from the crucible 21 on peripheral devices of the system 1 when the temperature of the crucible 21 rises. The water-cooled jacket 29 can be used together with the filaments 23 to serve as a temperature controller for controlling the temperature of the associated crucible 21 (the vapor deposition material 22). A film-thickness detection monitor and a controller therefor, which are available on the market, can be provided on an upper end of each crucible 21 so as not to overlap the vapor deposition area 20a of the glass substrate 20 positioned above the crucible 21. Due to this arrangement, the value of the electric current applied to the filaments 23 can be controlled by the film-thickness detection monitor and the controller therefor, so that a desired accumulation speed is obtained by monitoring the accumulation speed during the process of evaporation of the vapor deposition material onto the vapor deposition area 20a.

The successive vapor deposition system 1 that has the above described structure can be used as a system for manufacturing red-light-emitting organic electroluminescent devices in the following manner:

ITO glass substrates, on which a transparent electrode (ITO serving as an anode) has been formed in advance, are used as the glass substrates 20;

TPD which serves as a material of a hole-transporting layer of the organic electroluminescent device is provided in the crucible 21 in the first vapor deposition chamber 14;

$Alq_3$ which serves as a host material of a luminescent layer is provided in the central crucible 21B in the second vapor deposition chamber 15;

Rubrene which serves as a dopant material for yellow is provided in the crucible 21A in the second vapor deposition chamber 15; and DCM2 which serves as a dopant material for red is provided in the crucible 21C in the second vapor deposition chamber 15.

In this particular case, for the purpose of making DCM2 which serves as a red-light emission material emit light efficiently, rubrene is used to serve as an auxiliary dopant material for transferring excitation energy generated from $Alq_3$, which serves as host material, to DCM2 smoothly. At this time, the temperatures of the crucibles 21A, 21B and 21C in the second vapor deposition chamber (co-deposition chamber) 15 are controlled independently of each other so that the aforementioned rubrene, $Alq_3$ and DCM2 which are respectively contained in the crucibles 21A, 21B and 21C are vaporized to be co-deposited onto the vapor deposition area 20a of each glass substrate 20 at a desired mixture ratio. $Alq_3$ which serves as a material of an electron transporting layer is provided in the crucible 21 in the third vapor deposition chamber 16.

After such vapor deposition materials have been contained in the five crucibles 21, layer-forming operations (vapor deposition operations) are performed in the following manner.

First of all, each of the preliminary vacuum chamber 13, the first through third vapor deposition chambers 14, 15 and 16, and the preliminary ejection chamber 17 is exhausted to a predetermined degree of vacuum, and the respective crucible is heated to a predetermined temperature in advance. In this state, each of the glass substrates 20 mounted on the substrate holders 10 is firstly brought into the first vapor deposition chamber 14 so that the vaporized material (TPD) ascending therefrom is deposited onto the vapor deposition area 20a to form a hole-transporting layer thereon.

Subsequently, the glass substrate 20 on which the hole-transporting layer has been formed is brought into the second vapor deposition chamber (co-deposition chamber) 15 so that the three vaporized materials (rubrene, Alq$_3$ and DCM2) ascending therefrom are co-deposited onto the vapor deposition area 20a to form a luminescent layer on the hole-transporting layer. The ratio (co-deposition ratio) of the accumulation speed of the vapor deposition material from the crucible 21A, to the accumulation speed of the vapor deposition material from the crucible 21B, and to the accumulation speed of the vapor deposition material from the crucible 21C can be precisely controlled by controlling the heating temperatures of the crucibles 21A, 21B and 21C so that the accumulation speed of the vapor deposition material from each of the crucibles 21A, 21B and 21C which is monitored by the associated film thickness detection monitor becomes a desired speed.

Furthermore, the glass substrate 20 on which the luminescent layer has been formed is brought into the third vapor deposition chamber 16 so that the vaporized material (Alq$_3$) ascending therefrom is deposited onto the vapor deposition area 20a to form an electron-transporting layer thereon. If other layers such as an electrode layer serving as a cathode needs to be formed on each glass substrate 20, the successive vapor deposition system 1 only needs to add one or more additional vapor deposition chambers.

In the present embodiment of the successive vapor deposition system 1 in which thin layers of different vapor deposition materials are co-deposited onto each glass substrate 20 uniformly as the glass substrates 20 are conveyed linearly, the control of the layer thickness can be achieved by controlling the accumulation speeds detected by the aforementioned film thickness detection monitor and also the conveying speed of the glass substrates 20. In this case, the layer thickness can be controlled by moving the glass substrates 20 back and forth intentionally so that the glass substrates 20 reciprocate above the crucibles 21 and by adjusting the number of the reciprocating motions and the moving speed of the glass substrates 20. This control can be combined with the layer thickness control using the double-doored shutter 28, which is provided at the top of the crucibles 21.

Unlike a conventional successive vapor deposition system in which substrates are successively transferred from one chamber to another among a plurality of vacuum deposition chambers via a robotic system of a central vacuum carrier robotic chamber positioned at the center of the plurality of vacuum deposition chambers, the above-described layer forming process has the following features:

(1) layers of vapor deposition materials can be successively formed onto the vapor deposition area 20a of each glass substrate 20 as the glass plates 20 are conveyed in the conveying direction;

(2) a layer of each vapor deposition material can be formed on a large vapor deposition area easily because each entire layer can be formed on the vapor deposition area 20a of each glass substrate 20 at the same time in the direction of the width Y (see FIG. 2) of the vapor deposition area 20a;

(3) different vapor deposition materials can be vaporized to be co-deposited entirely onto the vapor deposition area 20a of each glass substrate 20 to form a layer of the different vapor deposition materials at a given precise ratio (co-deposition ratio); and (4) a layer of each vapor deposition material can be formed on the vapor deposition area 20a of each glass substrate 20 with minimum waste of the vapor deposition materials.

Although the above illustrated embodiment of the successive vapor deposition system is provided with a plurality of vapor deposition chambers (14, 15 and 16), it is possible to provide a vapor deposition system including only one vapor deposition chamber corresponding to one of the first and third vapor deposition chambers 14 and 16. According to this vapor deposition system, a vapor deposition material can be deposited onto the vapor deposition area 20a of each glass substrate 20 with minimum waste of the vapor deposition material. Moreover, it is possible to provide a vapor deposition system including only one vapor deposition chamber corresponding to the second vapor deposition chamber (co-deposition chamber) 15. According to this vapor deposition system, different vapor deposition materials can be co-deposited onto the vapor deposition area 20a of each glass substrate 20 with minimum waste of the vapor deposition materials while the co-deposition ratio can be controlled precisely.

In the above illustrated embodiment of the successive vapor deposition system, a process of depositing different organic substances onto an ITO glass substrate to form the hole-transporting layer, a luminescent layer and the electron-transporting layer successively on the ITO glass substrate has been discussed. A cathode layer needs to be formed on the electron-transporting layer to provide an organic electroluminescent device as a completed product. Since a vapor deposition area of the glass substrate onto which a material of the cathode layer is deposited is not identical to that onto which the organic substances of the hole-transporting layer, the luminescent layer, and the electron-transporting layer are deposited, it is generally the case that a vapor deposition area of the glass substrate on which the organic substances are deposited is defined by a shadow mask (or a member having both a function of a shadow mask and also a function of a substrate holder on which the glass substrate is mounted). A mechanism for placing, removing, replacing and/or positioning such a shadow mask or dual-function member is known in the art, and is not related to the purpose of the present invention. Accordingly, a process of forming the cathode layer on the electron-transporting layer is not herein discussed. The cathode layer can be formed on the electron-transporting layer in a manner similar to the above described manner of forming another layer on the glass substrate after a vapor deposition area of the glass substrate, onto which a material of the cathode layer is deposited, is defined. Although the inner space of each crucible 21 is partitioned by the plurality of partitions 21P which extend in a direction oblique to the conveying direction, the present invention is not limited solely to this particular arrangement. Namely, the plurality of crucibles can be arranged in a direction perpendicular to the conveying direction.

As can be understood from the foregoing, according to the present invention, a vapor deposition system which makes it possible to form layers of vapor deposition materials on a substrate successively with efficiency and with minimum waste of the vapor deposition materials is achieved. Moreover, a vapor deposition system which makes it possible to form a layer of a vapor deposition material on a substrate with minimum waste of the vapor deposition material is achieved. Furthermore, a vapor deposition system which makes it possible to co-deposit different vapor deposition materials onto a substrate to form layers of different vapor deposition materials thereon at a specific ratio with minimum waste of the vapor deposition materials is achieved.

Obvious changes may be made in the specific embodiment of the present invention described herein, such modifications being within the spirit and scope of the invention claimed. It is indicated that all matter contained herein is illustrative and does not limit the scope of the present invention.

What is claimed is:

1. A successive vapor deposition system, for forming an organic electroluminescence device having layers of organic materials between the anode and the cathode, in which at least some of the organic materials are heated, vaporized in a vacuum, and sequentially vapor-deposited onto a vapor deposition area of a substrate to form said layers thereon, said successive vapor deposition system comprising:
    a conveyor which conveys said substrate in a conveying direction parallel to a horizontal plane on which said substrate lies, wherein said vapor deposition area faces downward and is exposed through the underside of said conveyor;
    a plurality of vapor deposition chambers aligned in said conveying direction, wherein each of said vapor deposition chambers comprises a space through which said substrate is conveyed in said conveying direction;
    a plurality of containers positioned in said plurality of vapor deposition chambers, below said horizontal plane on which said substrate lies, wherein each of said containers contains one of said organic materials and has a plurality of partitions positioned therein, each of said partitions extending parallel to each other in a direction that is not perpendicular to the conveying direction and extending more than halfway up to an edge of an opening of said container, and wherein a width of each of said containers covers said vapor deposition area in a direction perpendicular to said conveying direction; and
    a heating medium provided for each of said containers for heating said organic materials;
    wherein at least one of said plurality of vapor deposition chambers is provided with at least two of said containers positioned therein, and wherein respective top openings of said at least two containers extend in a direction perpendicular to said conveying direction so that the organic materials in the at least two containers are co-deposited onto a common area on said vapor deposition area of said substrate.

2. The successive vapor deposition system according to claim 1, wherein a first of said at least two containers is adjustably tilted at a desired angle relative to a second of said at least two containers in order to define said common area.

3. The successive vapor deposition system according to claim 1, wherein said plurality of partitions extend parallel to each other in a direction oblique to said conveying direction.

4. The successive vapor deposition according to claim 1, further comprising at least one container each having a metal therein for vapor deposition, and at least one container each having an inorganic compound therein for vapor deposition.

5. The successive vapor deposition system according to claim 1, wherein said conveyer comprises at least one substrate holder on which said substrate is mounted, and wherein an opening is formed on said substrate holder so that said vapor deposition area is exposed through the underside of said substrate holder via said opening.

6. The vapor deposition system according to claim 1, wherein for each of at least one of said plurality of containers, a depth of the container is greater than the dimension of the container in the conveying direction.

7. A successive vapor deposition system in which at least one vapor deposition material is heated, vaporized in a vacuum, and deposited onto a vapor deposition area of a substrate, said successive vapor deposition system comprising:
    a conveyor which conveys said substrate in a conveying direction parallel to a horizontal plane on which said substrate lies, wherein said vapor deposition area faces downward and is exposed through the underside of said conveyor;
    a plurality of vapor deposition chambers aligned in said conveying direction, wherein each of said vapor deposition chambers comprises a space through which said substrate is conveyed in said conveying direction;
    a plurality of containers positioned in said plurality of vapor deposition chambers, below said horizontal plane on which said substrate lies, and configured for containing said at least one vapor deposition material, at least one of said containers having a plurality of partitions positioned therein, each of said partitions extending parallel to each other in a direction that is not perpendicular to said conveying direction and extending more than halfway up to an edge of an opening of said container, wherein a width of each of said containers covers said vapor deposition area in a direction perpendicular to said conveying direction; and
    a heating medium provided for each of said containers for heating said vapor deposition material therein.

8. The successive vapor deposition system according to claim 7, wherein at least one of said plurality of vapor deposition chambers is provided with at least two of said containers positioned therein, and wherein respective top openings of said at least two containers extend in a direction perpendicular to said conveying direction so that respective vaporized materials ascending from said at least two containers are co-deposited onto a common area on said vapor deposition area of said substrate.

9. The successive vapor deposition system according to claim 8, wherein a first of said at least two containers is adjustably tilted at a desired angle relative to a second of said at least two containers in order to define said common area.

10. The successive vapor deposition system according to claim 7, wherein said plurality of partitions extend parallel to each other in a direction oblique to said conveying direction.

11. The successive vapor deposition according to claim 7, wherein said at least one vapor deposition material comprises at least one of an organic substance, a metal, and an inorganic compound.

12. The successive vapor deposition system according to claim 11, wherein said successive vapor deposition system is used to form at least one layer of an organic electroluminescent device.

13. The successive vapor deposition system according to claim 7, wherein said conveyer comprises at least one substrate holder on which said substrate is mounted, and wherein an opening is formed on said substrate holder so that said vapor deposition area is exposed through the underside of said substrate holder via said opening.

14. The vapor deposition system according to claim 7, wherein for each of at least one of said plurality of containers, a depth of the container is greater than the dimension of the container in the conveying direction.

15. A successive vapor deposition system in which at least one vapor deposition material is heated, vaporized in a vacuum, and deposited onto a vapor deposition area of a substrate, said successive vapor deposition system comprising:
   a conveyor which conveys said substrate in a conveying direction parallel to a horizontal plane on which said substrate lies, wherein said vapor deposition area faces downward and is exposed through the underside of said conveyor;
   a plurality of vapor deposition chambers aligned in said conveying direction, wherein each of said vapor deposition chambers comprises a space through which said substrate is conveyed in said conveying direction;
   a plurality of containers positioned in said plurality of vapor deposition chambers, below said horizontal plane on which said substrate lies, and containing said at least one vapor deposition material, at least one of said containers having a plurality of partitions positioned therein, each of said partitions extending parallel to each other in a direction not perpendicular to the conveying direction and extending more than halfway up to an edge of an opening of said container, wherein a width of each of said containers covers said vapor deposition area in a direction perpendicular to said conveying direction; and
   a heating medium provided for each of said containers for heating said vapor deposition material;
   wherein at least one of said plurality of vapor deposition chambers is provided with at least two of said containers positioned therein, and wherein respective top openings of said at least two containers extend in a direction perpendicular to said conveying direction so that respective vaporized materials ascending from said at least two containers are co-deposited onto a common area on said vapor deposition area of said substrate;
   wherein a first of said at least two containers is adjustably tilted at a desired angle relative to a second of said at least two containers in order to define said common area.

16. The successive vapor deposition system according to claim 15, wherein said plurality of partitions extend parallel to each other in a direction oblique to said conveying direction.

17. The successive vapor deposition according to claim 15, wherein said at least one vapor deposition material comprises at least one of an organic substance, a metal, and an inorganic compound.

18. The vapor deposition system according to claim 17, wherein said successive vapor deposition system is used to form at least one layer of an organic electroluminescent device.

19. The successive vapor deposition system according to claim 15, wherein said conveyer comprises at least one substrate holder on which said substrate is mounted, and wherein an opening is formed on said substrate holder so that said vapor deposition area is exposed through the underside of said substrate holder via said opening.

20. The vapor deposition system according to claim 15, wherein for each of at least one of said plurality of containers, a depth of the container is greater than the dimension of the container in the conveying direction.

21. A successive vapor deposition system in which at least one vapor deposition material is heated, vaporized in a vacuum, and deposited onto a vapor deposition area of a substrate, said successive vapor deposition system comprising:
   a conveyor which conveys said substrate in a conveying direction parallel to a horizontal plane on which said substrate lies, wherein said vapor deposition area faces downward and is exposed through the underside of said conveyor;
   a plurality of vapor deposition chambers aligned in said conveying direction, wherein each of said vapor deposition chambers comprises a space through which said substrate is conveyed in said conveying direction;
   at least one container positioned in one of said plurality of vapor deposition chambers, below said horizontal plane on which said substrate lies, and configured for containing said vapor deposition material, wherein a width of said at least one container covers said vapor deposition area in a direction perpendicular to said conveying direction and wherein a top opening of said at least one container extends in a direction perpendicular to said conveying direction; and
   a heating medium provided for said at least one container for heating said vapor deposition material contained therein;
   wherein said at least one container comprises a plurality of partitions which partition an inner space of said at least one container; and
   wherein said plurality of partitions extend parallel to each other in a direction oblique to said conveying direction.

22. The successive vapor deposition system according to claim 21, wherein at least one of said plurality of vapor deposition chambers is provided with at least two of said containers positioned therein, and wherein respective top openings of said at least two containers extend in a direction perpendicular to said conveying direction so that respective vaporized materials ascending from said at least two containers are co-deposited onto a common area on said vapor deposition area of said substrate.

23. The successive vapor deposition system according to claim 22, wherein a first of said at least two containers is tilted at a desired angle relative to a second of said at least two containers in order to define said common area.

24. The successive vapor deposition system according to claim 21, wherein a depth of said at least one container is determined so that said vapor deposition material to be vaporized which is contained in said container ascends in a direction of said depth through said container and toward said vapor deposition area of said substrate.

25. The successive vapor deposition according to claim 21, wherein said at least one vapor deposition material comprises at least one of an organic substance, a metal, and an inorganic compound.

26. The successive vapor deposition system according to claim 25, wherein said successive vapor deposition system is used to form at least one layer of an organic electroluminescent device.

27. The successive vapor deposition system according to claim 21, wherein said conveyer comprises at least one substrate holder on which said substrate is mounted, and wherein an opening is formed on said substrate holder so that said vapor deposition area is exposed through the underside of said substrate holder via said opening.

* * * * *

UNITED STATES PATENT AND TRADEMARK OFFICE
CERTIFICATE OF CORRECTION

PATENT NO.        : 7,429,300 B2
APPLICATION NO.   : 10/152697
DATED             : September 30, 2008
INVENTOR(S)       : Junji Kido et al.

It is certified that error appears in the above-identified patent and that said Letters Patent is hereby corrected as shown below:

Title Page item 73
The correct Assignee information should read as follows:

Junji Kido, Nara-ken (JP);
ROHM Co., Ltd., Kyoto (JP)

Signed and Sealed this

Seventh Day of April, 2009

JOHN DOLL
*Acting Director of the United States Patent and Trademark Office*